US007471711B2

United States Patent
Kuramoto (10) Patent No.: US 7,471,711 B2
(45) Date of Patent: Dec. 30, 2008

(54) SEMICONDUCTOR LIGHT EMITTING DEVICE

(75) Inventor: Kyosuke Kuramoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 110 days.

(21) Appl. No.: 11/262,932

(22) Filed: Nov. 1, 2005

(65) Prior Publication Data
US 2006/0098703 A1 May 11, 2006

(30) Foreign Application Priority Data
Nov. 9, 2004 (JP) ............ 2004-324771

(51) Int. Cl.
*H01S 5/00* (2006.01)
(52) U.S. Cl. ............ 372/45.01; 372/43.01; 372/45.012
(58) Field of Classification Search ............ 372/45.01, 372/43.01, 45.012
See application file for complete search history.

(56) References Cited

U.S. PATENT DOCUMENTS

| | | | |
|---|---|---|---|
| 5,886,367 A | 3/1999 | Udagawa | |
| 6,465,810 B1 | 10/2002 | Tamada et al. | |
| 6,555,403 B1 | 4/2003 | Domen et al. | |
| 6,603,147 B1 | 8/2003 | Hashimoto et al. | |
| 6,614,059 B1 | 9/2003 | Tsujimura et al. | |
| 7,142,575 B2 | 11/2006 | Yamasaki et al. | |
| 2002/0053676 A1 | 5/2002 | Kozaki | |
| 2002/0141468 A1* | 10/2002 | Ito et al. ............ | 372/45 |
| 2002/0141469 A1* | 10/2002 | Yamasaki et al. ............ | 372/46 |
| 2005/0098789 A1* | 5/2005 | Kozaki ............ | 257/97 |
| 2005/0152419 A1* | 7/2005 | Kishimoto et al. ............ | 372/43 |
| 2005/0226295 A1* | 10/2005 | Taneya et al. ............ | 372/45.01 |
| 2006/0262823 A1* | 11/2006 | Sugimoto et al. ............ | 372/45.01 |
| 2007/0057276 A1* | 3/2007 | Kiyoku et al. ............ | 257/103 |

(Continued)

FOREIGN PATENT DOCUMENTS

EP 0 966 077 A2 12/1999

(Continued)

OTHER PUBLICATIONS

Hatakoshi et al., "Analysis of Device Characteristics for InGaN Semiconductor Lasers", Japanese Journal of Applied Physics vol. 38, Mar. 1999, pp. 1780-1785, Part 1, No. 3B, Publication Board, Japan.

(Continued)

*Primary Examiner*—Minsun Harvey
*Assistant Examiner*—Phillip Nguyen
(74) *Attorney, Agent, or Firm*—Leydig, Voit & Mayer, Ltd.

(57) ABSTRACT

A semiconductor light emitting device including an active layer interposed between an n-type cladding layer and a p-type cladding layer employs an $Al_xGa_{1-x}N$ (AlGaN) layer having an Al composition ratio x satisfying $0.01 \leq x < 0.06$ as the n-type cladding layer. As the Al composition ratio x decreases below 0.06, the AlGaN layer increases in refractive index. Thus, the near field pattern (NFP) in the vertical direction can spread out, and full width at half maximum of FFP in the vertical direction can be minimized. Further, since lattice mismatch with a GaN substrate is reduced with decreasing Al composition ratio, the AlGaN layer can be thick without causing cracks or dislocations, and spreading of light into the GaN substrate can be minimized.

12 Claims, 5 Drawing Sheets

U.S. PATENT DOCUMENTS

2007/0153854 A1 * 7/2007 Taneya et al. ............ 372/45.01

FOREIGN PATENT DOCUMENTS

| GB | 2 316 226 | 2/1998 |
|----|-----------|--------|
| JP | 10-256660 | 9/1998 |
| JP | 11-238945 | 8/1999 |
| JP | 11-340569 | 12/1999 |
| JP | 11-340580 | 12/1999 |
| JP | 2000-91705 | 3/2000 |
| JP | 2002-111133 | 4/2002 |
| JP | 2004-6970 | 1/2004 |
| JP | 2004-253776 | 9/2004 |

OTHER PUBLICATIONS

Tojyo et al., "High-Power AlGaInN Laser Diodes with High Kink Level and Low Relative Intensity Noise", Japanese Journal of Applied Physics vol. 41, Mar. 2002, pp. 1829-1833, Part 1, No. 3B.

* cited by examiner

SEMICONDUCTOR LIGHT EMITTING DEVICE

BACKGROUND OF THE INVENTION

1. Field of the Invention

The present invention relates to a semiconductor light emitting device employing III-V nitride compound semiconductor.

2. Description of the Background Art

In recent years, active research and development has been being conducted in semiconductor lasers employing III-V nitride compound semiconductor such as AlGaInN as semiconductor lasers capable of emitting light in an area ranging from the blue region to the ultraviolet region necessary for achieving higher density of optical disks, and such semiconductor lasers have already been put into practical use.

Semiconductor lasers employing III-V nitride compound semiconductor which have been reported so far have a separate confinement heterostructure (SCH).

More specifically, to effectively confine light in an active layer, an n-type AlGaN cladding layer made of a material having a relatively low refractive index is provided on the n-side, while a p-type AlGaN cladding layer made of a material also having a relatively low refractive index is provided on the p-side.

Further, an n-side optical guiding layer made of a material having a relatively high refractive index is provided between the n-type AlGaN cladding layer and active layer, while a p-side optical guiding layer made of a material having a relatively high refractive index is provided between the p-type AlGaN cladding layer and active layer.

An AlGaN cladding layer has a lower refractive index with increasing Al composition ratio. Accordingly, the use of an AlGaN cladding layer having a high Al composition ratio allows light distribution to converge to the vicinity of the active layer. This is because light attenuation with distance from the active layer increases with growing difference between an effective refractive index in optical mode and refractive index of a material. This increases optical confinement in the active layer, which advantageously reduces a threshold value.

On the n-side, a GaN material is generally stacked on a surface of the n-type AlGaN cladding layer farther away from the active layer. In the case of employing a substrate such as sapphire or SiC which produces a great lattice mismatch with GaN, a low-temperature GaN buffer layer for lessening the lattice mismatch is stacked between the substrate and cladding layer. In the case of employing a dislocation-reducing technique or the like using a lateral growing method of GaN material, a GaN lateral-grown layer having a thickness of several micrometers or more is stacked between the substrate and AlGaN cladding layer. In the case of employing a GaN substrate, which has become used popularly in recent years, the GaN substrate shall also be present under the n-type AlGaN cladding layer.

As described above, in the case where a GaN material or a material having a refractive index higher than the effective refractive index in optical mode is provided on the surface of the n-type. AlGaN cladding layer farther away from the active layer, such material shall have a high light-confinement coefficient since light intensity is less likely to be attenuated even with distance from the active layer. A problem is known in that light confinement in the active layer thus decreases relatively, causing characteristic degradation such as a significant increase in threshold value (cf. Japanese Journal of Applied Physics Vol. 38 Part 1, No. 3B (1999) p. 1780-).

Since Fresnel reflection of light occurs at the interface between the GaN layer and a sapphire or SiC substrate having a different refractive index from the GaN layer or occurs on the lower surface of the GaN substrate, a resonant mode is created within the GaN layer or GaN substrate. The resonant mode has a problem of causing a ripple in a far-field pattern (FFP) in the vertical direction, which has been confirmed by actual measurement, simulation and the like.

To solve such problems, it is necessary to minimize the spreading of light into a GaN material provided on the surface of the n-type AlGaN cladding layer farther away from the active layer or a material having a refractive index higher than the effective refractive index of an optical mode. Therefore, the n-type AlGaN cladding layer needs to be increased in Al composition ratio, that is, needs to be reduced in refractive index to significantly attenuate the light intensity with distance from the active layer so that the light intensity is sufficiently attenuated within the n-type AlGaN cladding layer. To significantly attenuate the light intensity with distance from the active layer, it is preferable to form the n-type AlGaN cladding layer as thick as possible.

On the other hand, the GaN buffer layer grown at low temperatures on a sapphire or SiC substrate and the GaN layer or GaN substrate grown on the sapphire substrate by the lateral-growing method have a lattice constant very close to that of GaN.

When growing the n-type AlGaN layer on these layers as an n-type cladding layer, the lattice constant of the AlGaN material decreases with increasing Al composition ratio. Thus, the lattice mismatch with the underlying layer increases with increasing Al composition ratio. As a result, it is known that the occurrence of cracks or dislocation become significant. Even when neither cracks or dislocation occurs, a great level of distortion occurs, which adversely affects the life of elements.

As described, in the case where the Al composition ratio of the n-type AlGaN cladding layer is excessively increased, a film thickness (critical film thickness) that can be grown without causing cracks or dislocation decreases. Thus, on the contrary, light is more likely to spread out into the substrate.

In light of the foregoing, it is generally known that the n- and p-type AlGaN cladding layers each have an Al composition ratio of optimum value, and an AlGaN material having an Al composition ratio of approximately 0.06 to 0.07 is used for both the n- and p-type AlGaN cladding layers (cf. T. Tojyo, et al. "High-Power AlGaInN Laser Diodes with High Kink Level and Low Relative Intensity Noise", Jpn. J. Appl. Phys. Vol. 41 (2002), pp. 1829-1833).

However, FFP in the vertical direction needs to be taken into account in determining the Al composition ratio of the n- and p-type AlGaN cladding layers. Generally, in nitride-based laser diodes for application in optical disks, the angle at full width at half maximum of FFP in a direction parallel to the substrate ranges approximately from 6 to 10° while the angle at the full width at half maximum of FFP in a direction perpendicular to the substrate is 20° or more. In this manner, beam-outgoing angles in the horizontal and vertical directions are significantly different from each other.

For application in optical disks, however, the ratio of angles at the full width at half maximum of FFP in the vertical and horizontal directions (aspect ratio) is required to be as close as possible to one. Therefore, it is preferable to minimize the full width at half maximum of FFP in the vertical direction.

Generally, a light distribution within a semiconductor laser element, that is, a near-field pattern (NFP) and FFP are in the relation of Fourier Transform. Therefore, to minimize the full width at half maximum of FFP in the vertical direction, NFP needs to spread out widely. This is achieved by, for example, a method of reducing the refractive index of an active layer to cause light to spread out widely in the vertical direction. This case, however, inevitably causes a problem of increased light absorption resulting from the wide spreading of light into a p-type contact layer or p-type electrode as well as the aforementioned problem of spreading of light into the substrate.

To solve these problems, the n- and p-type AlGaN cladding layers need to be increased in Al composition ratio or need to be formed thick, which, however, disadvantageously causes cracks or dislocation.

The above-described problems result from a specific structure of a semiconductor laser or semiconductor light emitting diode employing III-V nitride compound semiconductor in which a layer (e.g., GaN buffer layer or GaN substrate itself) having a refractive index higher than the effective refractive index is present closer to the substrate than the n-type cladding layer, and in which AlGaN cladding layers have a lattice constant different from that of underlying GaN.

As described, the spreading of light into the substrate, the occurrence of cracks or dislocation resulting from the lattice mismatch with the underlying layer and the problem about the full width at half maximum of FFP in the vertical direction are inseparably related to one another. To solve all these problems, a specific technique is required that can control the occurrence of cracks or dislocation even when the AlGaN cladding layers have a high Al composition ratio.

SUMMARY OF THE INVENTION

An object of the present invention is to provide a semiconductor light emitting device having good FFP characteristics without causing the spreading of light into the substrate or the occurrence of cracks or dislocation in an cladding layer.

According to a first aspect of the present invention, the semiconductor light emitting device employs III-V nitride compound semiconductor with an active layer interposed between an n-type cladding layer and a p-type cladding layer. The n-type cladding layer includes an n-type $Al_xGa_{1-x}N$ layer having an Al composition ratio x satisfying $0.01 \leq x < 0.06$.

An $Al_xGa_{1-x}N$ film having an Al composition ratio x satisfying $0.01 \leq x < 0.06$ is employed as the n-type cladding layer. Accordingly, the n-type cladding layer has a high refractive index, allowing a near field pattern (NFP) in the vertical direction to spread out, so that the full width at half maximum of FFP in the vertical direction is reduced. Further, since a lattice mismatch between the n-type cladding layer and a GaN material is reduced with decreasing Al composition ratio, the n-type cladding layer can be formed thick without causing cracks or dislocation. The spreading of light into the substrate can be minimized by forming the n-type cladding layer thick.

According to a second aspect of the invention, the semiconductor light emitting device employs III-V nitride compound semiconductor with an active layer interposed between an n-type cladding layer and a p-type cladding layer. The n-type cladding layer includes a partial n-type AlGaN cladding layer having an Al composition ratio x higher than in another portion of the n-type cladding layer. The partial n-type AlGaN cladding layer is provided in one of a lower portion and a central portion of the n-type cladding layer.

Since light is significantly attenuated in the partial n-type AlGaN cladding layer having a high Al composition ratio, the spreading of light into the substrate can be minimized. Since the partial cladding layer is provided in a lower or central portion of the n-type cladding layer, the spreading of NFP in the vicinity of the active layer is hardly affected, so that the full width at half maximum of FFP in the vertical direction is not increased.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
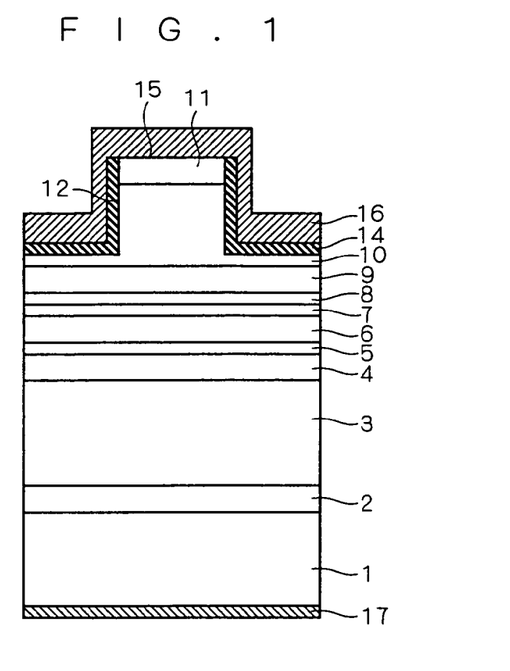
FIG. 1 is a sectional view illustrating the structure of a semiconductor light emitting device according to a first preferred embodiment of the present invention.

FIG. 1 is a sectional view illustrating the structure of a semiconductor light emitting device according to the present embodiment. This semiconductor light emitting device (nitride-based semiconductor laser) has a ridge structure and SCH structure.

An n-type GaN buffer layer 2 is formed on a Ga surface serving as a main surface of a GaN substrate 1 in order to reduce surface irregularities of the GaN substrate 1 to allow upper layers to be stacked thereon as flat as possible. An n-type AlGaN cladding layer (which may hereinafter be briefly referred to as an n-type cladding layer) 3 is formed on the n-type GaN buffer layer 2.

An n-type GaN optical guiding layer 4 and an undoped InGaN optical guiding layer 5 are stacked in this order on the n-type AlGaN cladding layer 3 to constitute an n-side optical guiding layer. On the InGaN optical guiding layer 5, an undoped active layer 6 of $In_xGa_{1-x}N/In_yGa_{1-y}N$ multiple quantum well structure is formed, for example.

On the active layer 6, an undoped InGaN optical wave guiding layer 7 serving as a p-side guiding layer, a p-type AlGaN electronic barrier layer 8, a p-type GaN optical guiding layer 9 serving as a p-side optical guiding layer, a p-type AlGaN cladding layer (which may hereinafter be briefly referred to as a p-type cladding layer) 10 and a p-type GaN contact layer 11 are stacked in this order.

The n-side GaN buffer layer 2 is e.g., 1 μm in thickness and contains e.g., Si doped as an n-type impurity. The n-type cladding layer 3 is e.g., 2.0 μm in thickness and contains e.g., Si doped as an n-type impurity with an Al composition ratio of e.g., 0.05. The n-type GaN optical guiding layer 4 is e.g., 100 nm in thickness. The undoped InGaN optical guiding layer 5 is e.g., 7 nm in thickness with an In composition ratio of e.g., 0.02.

The undoped active layer 6 has an $In_xGa_{1-x}N$ layer serving as a barrier layer and an $In_yGa_{1-y}N$ layer serving as a well layer stacked alternately in layers, and the number of wells is three, for example. The $In_xGa_{1-x}N$ layer serving as a barrier layer is 7 nm in thickness with a composition ratio x of 0.02. The $In_yGa_{1-y}N$ layer serving as a well layer is 3.5 nm in thickness with a composition ratio y of 0.14.

The undoped InGaN optical wave guiding layer 7 is e.g., 20 nm in thickness with an In composition ratio x of e.g., 0.02. The p-type AlGaN electronic barrier layer 8 is e.g., 10 nm in thickness with an Al composition ratio of e.g., 0.18. The p-type GaN optical guiding layer 9 is e.g., 100 nm in thickness.

The p-type AlGaN, cladding layer 10 is e.g., 400 nm in thickness and contains e.g., Mg doped as a p-type impurity with an Al composition ratio of e.g., 0.07. The p-type GaN contact layer 11 is e.g., 100 nm in thickness and contains e.g., Mg doped as a p-type impurity.

A ridge 12 is formed on the p-type AlGaN cladding layer 10 and p-type GaN contact layer 11 by etching towards <1-100>, for example. The ridge 12 is e.g., 2.0 μm in width, and is formed in positions corresponding to low defective areas defined between high dislocation areas formed on the GaN substrate 1 in stripes in a width of several micrometers to several tens of micrometers.

For surface protection and electric insulation of both sides and side bottoms of the ridge 12, an insulation film 14 such as a 200-nm-thick $SiO_2$ film is formed to cover the ridge 12.

The insulation film 14 has an opening 15 in a portion corresponding to the upper surface of the ridge 12. This opening 15 establishes an electric contact between a p-type electrode 16 and the p-type contact layer 11. The p-type electrode 16 has Pd films and Au films stacked alternatively, for example.

An n-type electrode 17 is formed on an N surface opposite to the Ga surface serving as one main surface of the GaN substrate 1. This n-type electrode 17 has Ti films and Au films stacked alternately, for example.

Next, a method of manufacturing the semiconductor light emitting device according to the present embodiment will be described. First, the n-type GaN buffer layer 2 is grown by metalorganic chemical vapor deposition (MOCVD) at a growing temperature of e.g., 1000° C. on the GaN substrate 1 with its surfaces previously cleaned by thermal cleaning or the like.

Then, the n-type cladding layer 3, n-type GaN optical guiding layer 4 and undoped InGaN optical guiding layer 5, undoped active layer 6, undoped InGaN optical wave guiding layer 7, p-type AlGaN electronic barrier layer 8, p-type GaN optical guiding layer 9, p-type cladding layer 10 and p-type GaN contact layer 11 are also stacked in this order by MOCVD.

Here, the n-type cladding layer 3 and n-type GaN optical guiding layer 4 shall be grown at e.g., 1000° C. The growing temperature of the optical guiding layer 5 and up to the optical wave guiding layer 7 shall be e.g., 740° C., and that of the electronic barrier layer 8 and up to the p-type contact layer 11 shall be e.g., 1000° C.

Next, a resist is coated on the whole surface of wafer having undergone the above-described crystal growth, to form a resist pattern of predetermined shape that corresponds to the shape of ridge 12 by the common lithography method (photolithography).

Using this resist pattern as a mask, etching is conducted into the p-type cladding layer 10 by reactive ion etching (RIE), for example. Through this etching, the ridge 12 of optical wave guiding structure is formed. A chlorine type gas, for example, is employed as an etching gas for RIE.

Next, the $SiO_2$ insulation film 14 of e.g., 0.2 μm thickness is formed on the overall surface of substrate by CVD, vacuum evaporation, sputtering or the like with the resist pattern used as a mask being left. Then, so-called lift-off of removing the $SiO_2$ film on the ridge 12 is performed concurrently with removal of the resist pattern. The opening 15 is thereby formed on the ridge 12.

Next, upon alternately forming Pt films and Au films on the overall surface of substrate by vacuum evaporation or the like, a resist is coated and formed into a predetermined shape by lithography. Thereafter, the p-type electrode 16 is formed on the surface of the semiconductor light emitting device by wet etching or dry etching using the resist as a mask.

Next, Ti films and Au films are formed alternately on the overall rear surface of substrate by vacuum evaporation. Subsequently, alloy treatment for bringing the n-type electrode 17 into ohmic contact therewith is conducted. Thereafter, the substrate is worked on into a bar by cleaving or the like to form both resonator edges. Further, upon performing edge coating on these resonator edges, this bar is cut into chips by cleaving or the like. Through the above-described method, the semiconductor light emitting device shown in FIG. 1 is manufactured.

The semiconductor light emitting device according to the present embodiment employs the n-type AlGaN cladding layer 3 having an Al composition ratio of 0.05. An n-type AlGaN material having an Al composition ratio lower than 0.06 has a refractive index lower than that of a material having an Al composition ratio of 0.06 or higher. Thus, employing an n-type AlGaN material having an Al composition ratio lower than 0.06 as the n-type cladding layer 3, light attenuation with distance from the active layer 6 tends to decrease. In other words, NFP tends to spread out. As a result, the full width at half maximum of FFP in the vertical direction can be reduced.

With decreasing Al composition ratio, the lattice constant of an AlGaN material increases to come closer to that of the GaN substrate 1 serving as an underlying layer. Thus, the critical film thickness that causes cracks or dislocation tends to increase. In other words, the n-type AlGaN cladding layer 3 can be grown thicker with decreasing Al composition ratio.

Accordingly, NFP spreads out with decreasing Al composition ratio of the n-type AlGaN cladding layer 3, causing light to spread out wider into the GaN substrate 1, however, the spreading of light may be minimized by growing the n-type AlGaN cladding layer 3 thicker.

Whether the spreading of light is minimized by reducing a lower Al composition ratio of the n-type AlGaN cladding layer 3 can be estimated by calculating a refractive index of an AlGaN material having a certain Al composition ratio and a minimum film thickness (critical film thickness) that causes cracks or dislocation, and calculating a light intensity distribution based on the obtained refractive index and film thickness.

Figure 2:
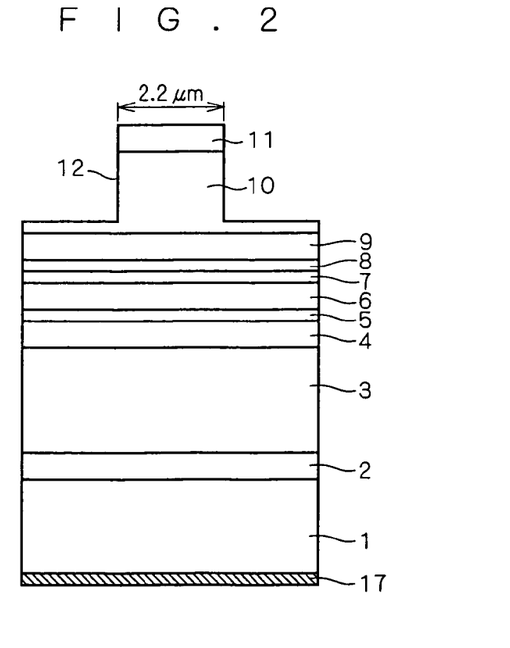
FIG. 2 is a sectional view illustrating the structure of a semiconductor light emitting device according to the first preferred embodiment for use in calculating light intensity.

Now, the results of calculation of light intensity distribution varying the Al composition ratio of the n-type cladding layer 3 will be described. FIG. 2 is a sectional view illustrating the structure of a semiconductor light emitting device used in calculating the light intensity distribution. Elements identical to those of the structure shown in FIG. 1 are indicated by the same reference numerals.

The GaN buffer layer 2 is formed on the GaN substrate 1. The n-type AlGaN cladding layer 3 is formed on the GaN buffer layer 2. The 100-nm-thick n-type GaN optical guiding layer 4 is formed on the n-type AlGaN cladding layer 3. The 7.0-nm-thick InGaN optical guiding layer 5 having an In composition ratio of 0.02 is formed on the n-type GaN optical guiding layer 4.

On the InGaN optical guiding layer 5, the multiple quantum well active layer 6 including three 3.5-nm-thick InGaN well layers having an In composition ratio of 0.12 and 7.0-nm-thick InGaN barrier layers having an In composition ratio of 0.02 is formed.

On the active layer 6, the 20-nm-thick InGaN optical guiding layer 7 having an In composition ratio of 0.02 is formed. On the InGaN optical guiding layer 7, the 20-nm-thick p-type AlGaN electronic barrier layer 8 having an Al composition ratio of 0.18 is formed.

On the barrier layer 8, the 100-nm-thick p-type GaN guiding layer 9, 400-nm-thick p-type AlGaN cladding layer 10 and 100-nm-thick p-type GaN contact layer 11 are stacked in this order.

The ridge 12 is 2.2 μm in width. Upon calculation of two-dimensional light intensity distribution, the ratio of spreading of light into the GaN buffer layer 2 and GaN substrate 1 is calculated.

Figure 3:
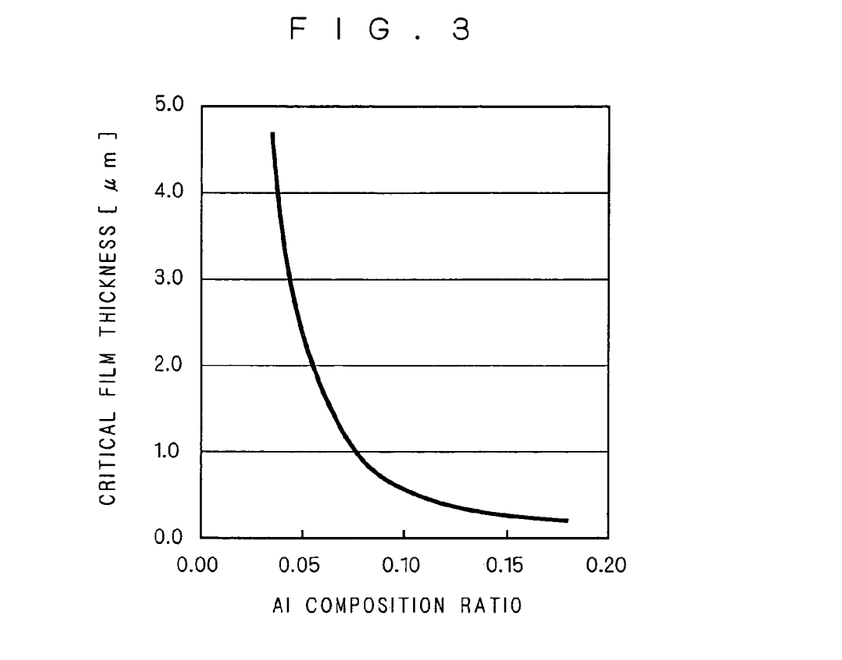
FIG. 3 illustrates the relationship between Al composition ratio and critical film thickness of an AlGaN layer, according to the first preferred embodiment.

FIG. 3 illustrates the dependence of critical film thickness (plotted in the vertical axis) of an AlGaN film grown on the GaN substrate 1 on the Al composition ratio (plotted in the horizontal axis) (cf. Journal of Applied Physics, vol. 88, No. 12 (2000) p. 7029). As understood from FIG. 3, the critical film thickness increases with decreasing Al composition ratio.

Figure 4:
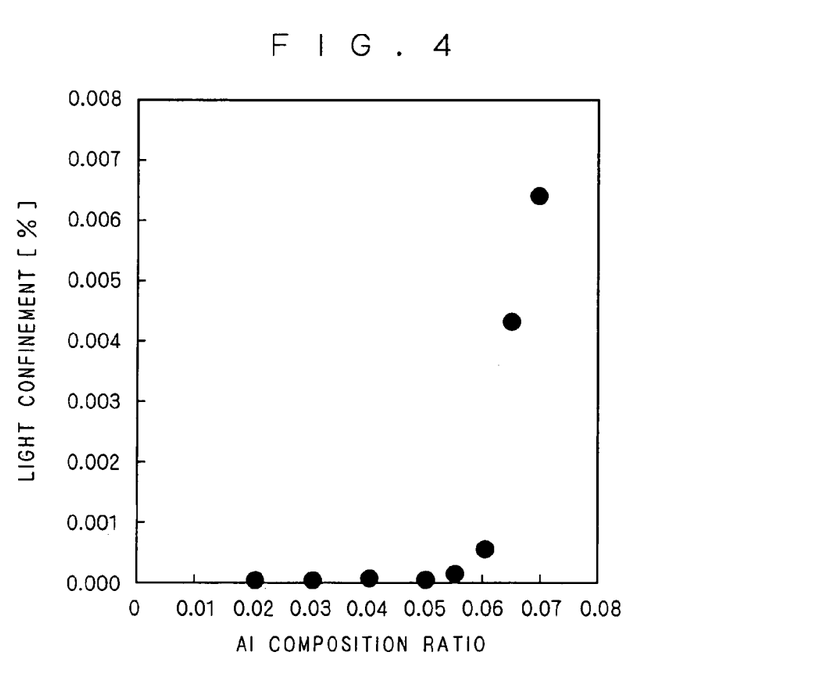
FIGS. 4 and 5 each illustrate the relationship between Al composition ratio and light confinement, according to the first preferred embodiment.

FIG. 4 illustrates the results of calculation of the ratio of light intensity, i.e., the ratio of spreading of light in the GaN buffer layer 2 and GaN substrate 1 with respect to the whole light intensity when forming the n-type cladding layer 3 having the same critical film thickness as that shown in FIG. 3 while varying the Al composition ratio of the cladding layer 3.

Figure 5:
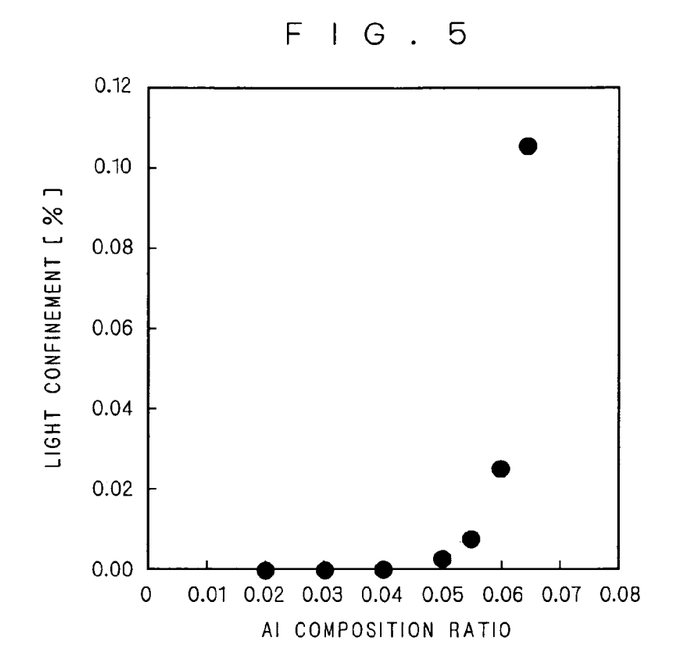

FIG. 5 illustrates the results of calculation of the ratio of spreading of light into the GaN buffer layer 2 and GaN substrate 1 in the case of forming the n-type cladding layer 3 not having the critical thickness, but having a thickness of 70% of the critical film thickness.

As understood from FIGS. 4 and 5, the ratio of spreading of light into the GaN substrate 1 can significantly be reduced by using the n-type AlGaN cladding layer 3 having an Al composition ratio lower than 0.06, rather than an Al composition ratio higher than 0.06.

Figure 6:
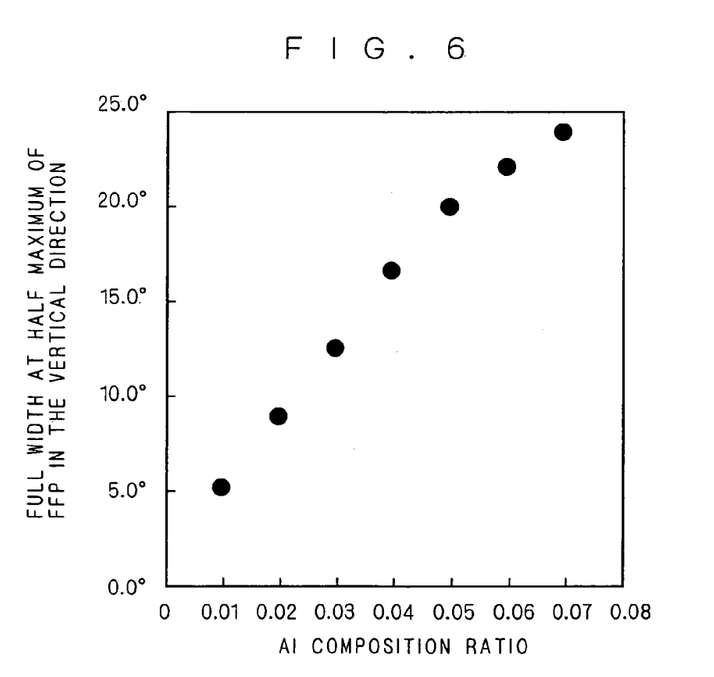
FIG. 6 illustrate the relationship between Al composition ratio and full width at half maximum of FFP in the vertical direction, according to the first preferred embodiment.

FIG. 6 illustrates the results of calculation of the full width at half maximum of FFP in the vertical direction (plotted in the vertical axis) with respect to the Al composition ratio of the AlGaN cladding layer 3 (plotted in the horizontal axis). Here, the n-type cladding layer 3 shall have the critical film thickness. As shown in FIG. 6, the full width at half maximum of FFP in the vertical direction decreases with decreasing Al composition ratio, and FFP can be formed in a shape more preferable for use in a light source for disks.

The semiconductor light emitting device according to the present embodiment employs a 2-μm-thick n-type AlGaN cladding layer 3 having an Al composition ratio x of 0.05. Since the critical film thickness is about 2.5 μm when the Al composition ratio x is 0.05 as understood from FIG. 3, the 2-μm-thick n-type cladding layer 3 can be formed on the GaN substrate 1 without causing cracks or dislocation. Further, as understood from FIGS. 4 and 5, the Al composition ratio of 0.05 hardly causes the problem of the spreading of light into the GaN substrate 1 side. Furthermore, as understood from FIG. 6, the Al composition ratio of 0.05 can reduce the full width at half maximum of FFP in the vertical direction as compared to the Al composition ratio of 0.06 or higher.

Based on the foregoing, the semiconductor light emitting device according to the present embodiment can reduce the full width at half maximum of FFP in the vertical direction without causing the problem of spreading of light or occurrence of cracks or dislocation.

In the present embodiment, the n-type AlGaN cladding layer 3 has an Al composition ratio x of 0.05 and a width of 2 μm, however, an Al composition ratio x satisfying $0.01 \leq x < 0.06$ can significantly minimize the spreading of light as compared to the Al composition ratio of 0.06 or higher. The n-type cladding layer 3 can sufficiently minimize the spreading of light when it has a film thickness of 300 nm or larger. The reason for setting the lower limit of the Al composition ratio at 0.01 is because an n-type cladding layer 3 having an Al composition ratio lower than 0.01 may cause insufficient light attenuation with distance from the active layer 6.

It is clear that an n-type AlGaN cladding layer 3 of multilayered structure including two or more layers can achieve the above-described effects when the respective layers have an Al composition ratio lower than 0.06. Further, even when the n-type AlGaN cladding layer 3 of multilayered structure including two or more layers wherein at least one layer has an Al composition ratio x satisfying $0.01 \leq x < 0.06$, similar effects can be achieved provided that the total thickness of layers having such Al composition ratio is 300 nm or higher.

Second Preferred Embodiment

A semiconductor light emitting device according to the present embodiment is the semiconductor light emitting device according to the first preferred embodiment, but the n-type AlGaN cladding layer 3 has an Al composition ratio satisfying $0.01 \leq x < 0.05$ (see FIG. 1). The other structure is the same as that described in the first preferred embodiment, and repeated explanation is thus omitted here.

As shown in FIG. 3, the critical film thickness of the n-type cladding layer 3 greatly improves when the Al composition ratio becomes 0.05 or lower. Therefore, the n-type cladding layer 3 can be formed thicker without causing cracks or dislocation. As a result, as understood from FIGS. 4 and 5, the spreading of light into the GaN substrate 1 side can further be minimized.

Further, the refractive index increases by reducing the Al composition ratio x. Accordingly, NFP can spread out widely to reduce the full width at half maximum of FFP in the vertical direction.

In view of the foregoing, setting the Al composition ratio x to satisfy $0.01 \leq x \leq 0.05$, a semiconductor laser with reduced cracks, reduced dislocation and very narrow full width at half maximum of FFP in the vertical direction can easily be obtained although having been difficult to achieve.

Third Preferred Embodiment

Figure 7:
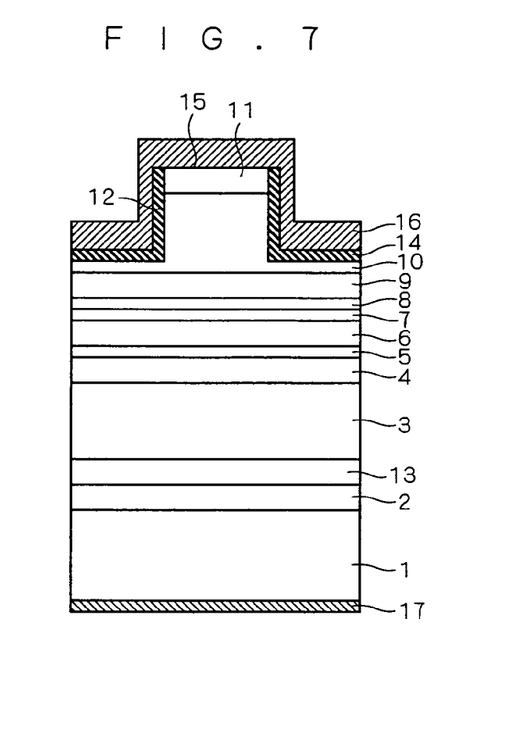
FIG. 7 is a sectional view illustrating the structure of a semiconductor light emitting device according to a third preferred embodiment of the invention.

FIG. 7 is a sectional view illustrating a semiconductor light emitting device according to the present embodiment. In the present embodiment, an n-type cladding layer 13 (partial n-type AlGaN cladding layer) having an Al composition ratio higher than that of the n-type $Al_xGa_{1-x}N$ cladding layer 3 ($0.01 \leq x < 0.06$) is additionally formed under the n-type cladding layer 3 in the semiconductor light emitting device according to the first preferred embodiment. The other structure is the same as that of the first preferred embodiment. The same components are indicated by the same reference numerals, and repeated explanation thereof is thus omitted here.

Figure 8:
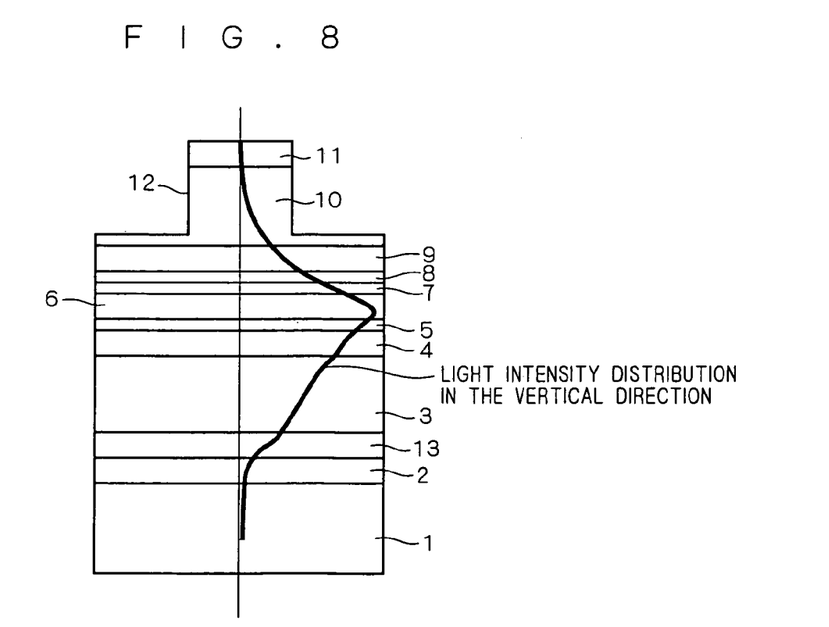
FIG. 8 is a sectional view illustrating light intensity in the vertical direction of the semiconductor light emitting device according to the third preferred embodiment.

FIG. 8 is a sectional view illustrating the distribution of light intensity in the vertical direction in the semiconductor light emitting device having the above-described structure. As shown in FIG. 8, the distribution of light intensity in the vertical direction is attenuated from the center of the active layer 6 toward the GaN substrate 1. The n-type cladding layer 13, having a refractive index lower than that of the cladding layer 3, can significantly attenuate the light intensity. As a result, the spreading of light into the GaN substrate 1 can further be minimized.

This is based on the result of calculation that the disposition of the thin n-type cladding layer 13 having a high Al composition ratio in a position at a certain distance from the active layer 6 is more advantageous than providing a film having a low Al composition ratio in terms of the control of the spreading of light and the occurrence of cracks or dislocation in the n-type cladding layer 3.

In light of the foregoing, the semiconductor light emitting device according to the present embodiment can further minimize the spreading of light into the substrate side as compared to the semiconductor light emitting device according to the first preferred embodiment.

Since the n-type cladding layer 3 positioned near the active layer 6 allows NFP to spread out widely, the effect of reducing FFP does not impaired seriously by providing the n-type cladding layer 13 under the n-type cladding layer 3.

Further, the n-type cladding layer 13 is provided under the n-type cladding layer 3 in the present embodiment, but may be provided in a central portion or lower portion of the n-type cladding layer 3.

Furthermore, the n-type cladding layer 13 is not limited to a single AlGaN layer, but may be a superlattice AlGaN layer having an average Al composition ratio z higher than the Al composition ratio of the cladding layer 3.

The average Al composition ratio z is expressed as: $z=(a \cdot x + b \cdot y)/(a+b)$ in a superlattice structure including, e.g., an AlGaN layer having a thickness of a and an Al composition ratio x and an AlGaN layer having a thickness of b and an Al composition ratio y. Strictly saying, the superlattice AlGaN layer has a refractive index slightly different from that of a single AlGaN layer having the average Al composition ratio z. However, in the sense of bringing about the effects of the invention equally, no problem arises in defining with the average Al composition ratio z.

Fourth Preferred Embodiment

A semiconductor light emitting device according to the present embodiment includes the n-type cladding layer 13 having a Al composition ratio higher than that of the n-type $Al_xGa_{1-x}N$ cladding layer 3 ($0.01 \leq x \leq 0.05$) additionally formed under the n-type cladding layer 3 of the semiconductor light emitting device according to the second preferred embodiment. The other structure is the same as that of the second preferred embodiment, and repeated explanation thereof is thus omitted here.

The semiconductor light emitting device according to the present embodiment can significantly attenuate the light intensity by means of the n-type cladding layer 13. Accordingly, the spreading of light into the GaN substrate 1 can further be minimized.

Since the n-type cladding layer 3 positioned near the active layer 6 allows NFP to spread out widely, the effect of reducing FFP does not impaired seriously by providing the n-type cladding layer 13 under the n-type cladding layer 3.

Further, the n-type cladding layer 13 is provided under the n-type cladding layer 3 in the present embodiment, but may be provided in a central portion or lower portion of the n-type cladding layer 3.

Furthermore, the n-type cladding layer 13 is not limited to a single AlGaN layer, but may include AlGaN layers of superlattice structure having an average Al composition ratio higher than the Al composition ratio of the n-type cladding layer 3.

Fifth Preferred Embodiment

The semiconductor light emitting device according to the present embodiment includes the n-type cladding layer 3 formed from AlGaN layers of superlattice structure in the semiconductor light emitting device according to the first preferred embodiment. The average Al composition ratio z of the n-type cladding layer 3 satisfies $0.01 \leq z < 0.06$. The other structure is the same as that of the first preferred embodiment, and repeated explanation thereof is thus omitted here.

The semiconductor light emitting device according to the present embodiment includes the n-type cladding layer 3 formed from AlGaN layers of superlattice structure having the average Al composition ratio z ($0.01 \leq z < 0.06$), and achieves similar effects as those of the first preferred embodiment.

Further, with employment of the superlattice structure in the n-type cladding layer 3, dislocation can be stopped at the interface of the superlattice structure. As a result, the n-type cladding layer 3 can easily be made thick through the use of the superlattice structure, and making the n-type cladding layer 3 thick the spreading of light can further be minimized by making the n-type cladding layer 3 thick.

In the case where the n-type cladding layer 3 includes a plurality of layers, an AlGaN layer of superlattice structure may be used as one of them.

Sixth Preferred Embodiment

A semiconductor light emitting device according to the present embodiment includes the n-type cladding layer 3 formed from AlGaN layers of superlattice structure. The average Al composition ratio z of the n-type cladding layer 3 satisfies $0.01 \leq z \leq 0.05$. The other structure is the same as that of the second preferred embodiment, and repeated explanation thereof is thus omitted here.

The semiconductor light emitting device according to the present embodiment has the above-described structure, and therefore, achieves similar effects as those of the second preferred embodiment.

Further, with employment of the superlattice structure in the n-type cladding layer 3, dislocation can be stopped at the interface of the superlattice structure. As a result, the n-type cladding layer 3 can easily be made thick through the use of the superlattice structure, and the spreading of light can further be minimized by making the n-type cladding layer 3 thick.

In the case where the n-type cladding layer 3 includes a plurality of layers, an AlGaN layer of superlattice structure may be used as one of them.

Seventh Preferred Embodiment

A semiconductor light emitting device according to the present embodiment includes the n-type cladding layer 3 formed from AlGaN layers of superlattice structure (the average Al composition ratio z: $0.01 \leq z < 0.06$) in the semiconductor light emitting device according to the third preferred embodiment.

The other structure is the same as that of the third preferred embodiment, and repeated explanation thereof is thus omitted here.

The semiconductor light emitting device according to the present embodiment has the above-described structure, and therefore, achieves similar effects as those of the third preferred embodiment.

Further, with employment of the superlattice structure in the n-type cladding layer 3, dislocation can be stopped at the interface of the superlattice structure. As a result, the n-type cladding layer 3 can easily be made thick through the use of the superlattice structure, and the spreading of light can further be minimized by making the n-type cladding layer 3 thick.

In the case where the n-type cladding layer 3 includes a plurality of layers, an AlGaN layer of superlattice structure may be used as one of them.

Eighth Preferred Embodiment

A semiconductor light emitting device according to the present embodiment includes the n-type cladding layer 3 formed from AlGaN layers of superlattice structure (the average Al composition ratio z: $0.01 \leq z \leq 0.05$) in the semiconductor light emitting device according to the fourth preferred embodiment. The other structure is the same as that of the fourth preferred embodiment, and repeated explanation thereof is thus omitted here.

The semiconductor light emitting device according to the present embodiment has the above-described structure, and therefore, achieves similar effects as those of the fourth preferred embodiment. In the case where the n-type cladding layer 3 includes a plurality of layers, an AlGaN layer of superlattice structure may be used as one of them.

Ninth Preferred Embodiment

A semiconductor light emitting device according to the present embodiment employs an AlGaN layer having an Al composition ratio x satisfying $0.01 \leq z < 0.06$ as the p-type cladding layer 10 in the first preferred embodiment. The other structure is the same as that of the first preferred embodiment, and repeated explanation thereof is thus omitted here.

In the semiconductor light emitting device according to the present embodiment, the p-type cladding layer 10 has an Al composition ratio x satisfying $0.01 \leq x < 0.06$. Accordingly, the refractive index of the p-type cladding layer 10 increases, allowing NFP in the vertical direction to spread out into the p-side as well. As a result, FFP in the vertical direction can further be minimized.

Setting the Al composition ratio x to satisfy $0.01 \leq x < 0.06$, the p-type cladding layer 10 can be formed thick, which can minimize the spreading of light into the p-type electrode 16.

Similarly, in the second through eighth preferred embodiments, the use of AlGaN layer having an Al composition ratio x satisfying $0.01 \leq x < 0.06$ for the p-type cladding layer can further reduce the full width at half maximum of FFP in the vertical direction.

Further, the spreading of light can be minimized sufficiently when the p-type cladding layer 10 is 300 nm or more in thickness.

Tenth Preferred Embodiment

In a semiconductor light emitting device according to the present embodiment, the p-type cladding layer 10 of the first preferred embodiment has an Al composition ratio x satisfying $0.01 \leq x \leq 0.05$.

The other structure is the same as that of the first preferred embodiment, and repeated explanation thereof is thus omitted here.

Setting the Al composition ratio x of the p-type cladding layer 10 to satisfy $0.01 \leq x \leq 0.05$ in the semiconductor light emitting device according to the present embodiment, the p-type cladding layer 10 can be formed thick without causing cracks or the like, so that the spreading of light into the p-type electrode 16 can further be minimized.

The refractive index increases by reducing the Al composition ratio. Accordingly, NFP can spread out widely, and FFP can be reduced further.

Similarly, in the second through eighth preferred embodiments, the use of AlGaN layer having an Al composition ratio x satisfying $0.01 \leq x \leq 0.05$ for the p-type cladding layer 10 can further reduce FFP.

Further, the spreading of light can be minimized sufficiently when the p-type cladding layer 10 is 300 nm or more in thickness.

Eleventh Preferred Embodiment

Figure 9:
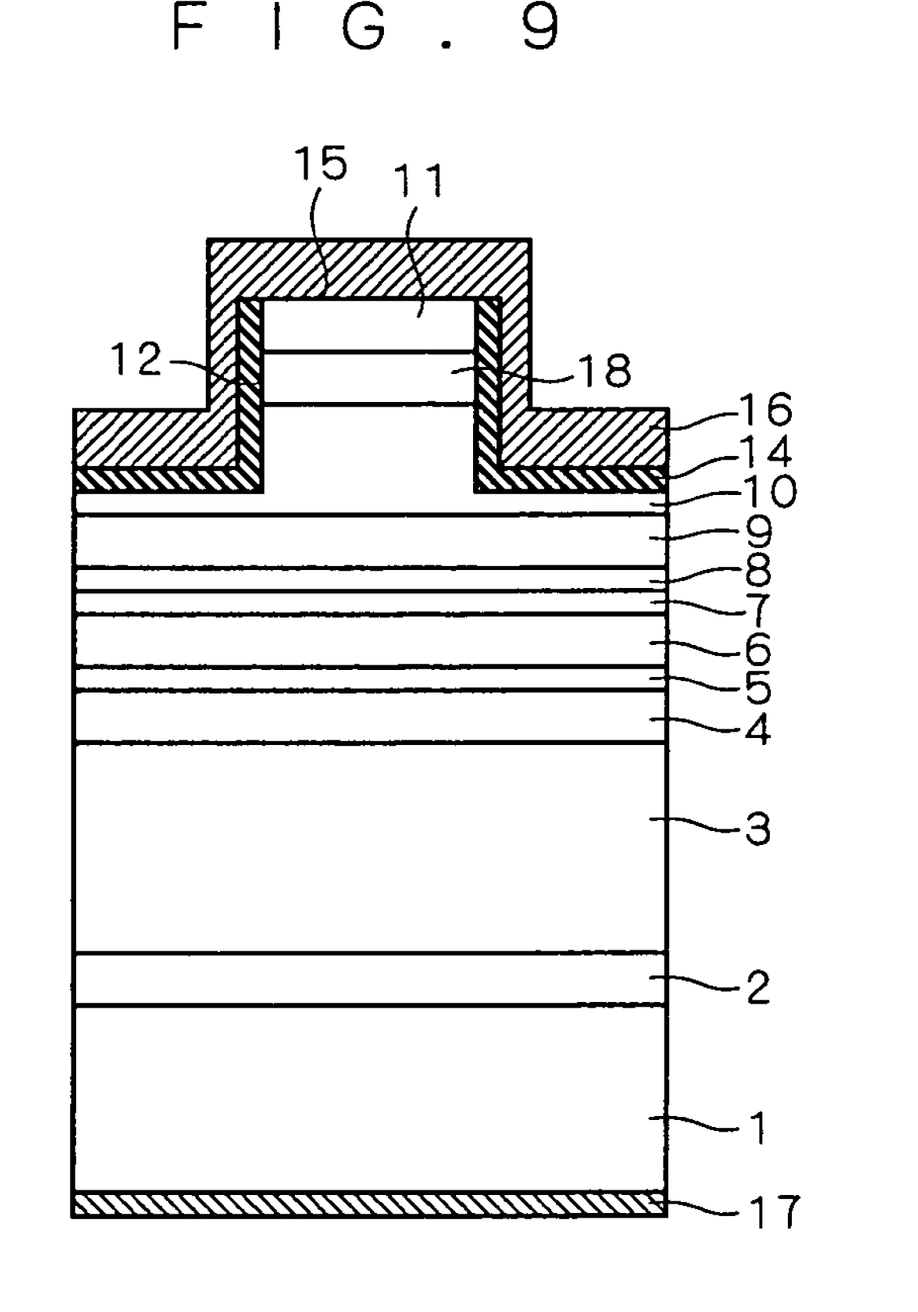
FIG. 9 is a sectional view illustrating the structure of a semiconductor light emitting device according to an eleventh preferred embodiment of the invention.

FIG. 9 is a sectional view illustrating the structure of a semiconductor light emitting device according to the present embodiment. The semiconductor light emitting device according to the present embodiment has a p-type cladding layer 18 (partial p-type AlGaN cladding layer) having an Al composition ratio higher than that of the p-type cladding layer 10 formed on the p-type cladding layer 10 (Al composition ratio x: $0.01 \leq x < 0.06$) in the semiconductor light emitting device according to the ninth preferred embodiment. The other structure is the same as that of the ninth preferred embodiment, and repeated explanation thereof is thus omitted here.

The p-type cladding layer 18 has a refractive index lower than that of the p-type cladding layer 10, and can thus significantly attenuate the light intensity.

Accordingly, the provision of the p-type cladding layer 18 on the p-type cladding layer 10 can further minimize the spreading of light into the p-type electrode 16.

Here, the p-type cladding layer 18 may not necessarily be formed on the p-type cladding layer 10, but may be provided in a central portion or upper portion of the p-type cladding layer 10.

Since the p-type cladding layer 10 positioned near the active layer 6 allows NFP to spread out, the effect of reducing FFP does not impaired seriously by providing the p-type cladding layer 18 in a central portion or upper portion of the p-type cladding layer 10.

Further, the p-type cladding layer 10 is not limited to a single AlGaN layer, but may include AlGaN layers of superlattice structure having an average Al composition ratio z higher than the Al composition ratio of the p-type cladding layer 10.

Twelfth Preferred Embodiment

The semiconductor light emitting device according to the present embodiment includes the p-type cladding layer 18 having an Al composition ratio higher than that of the p-type cladding layer 10 formed on the p-type cladding layer 10 (Al composition ratio: $0.01 \leq x \leq 0.05$) in the semiconductor light emitting device according to the tenth preferred embodiment. The other structure is the same as that of the tenth preferred embodiment, and repeated explanation thereof is thus omitted here.

The p-type cladding layer 18 has a refractive index lower than that of the p-type cladding layer 10, and can thus significantly attenuate the light intensity.

Accordingly, the provision of the p-type cladding layer 18 on the p-type cladding layer 10 can further minimize the spreading of light into the p-type electrode 16.

Here, the p-type cladding layer 18 may not necessarily be formed on the p-type cladding layer 10, but may be provided in a central portion or upper portion of the p-type cladding layer 10.

Since the p-type cladding layer 10 positioned near the active layer 6 allows NFP to spread out, the effect of reducing FFP does not impaired seriously by providing the p-type cladding layer 18 in a central portion or upper portion of the p-type cladding layer 10.

Further, the p-type cladding layer 10 is not limited to a single AlGaN layer, but may include AlGaN layers of superlattice structure having an average Al composition ratio z higher than the Al composition ratio of the p-type cladding layer 10.

Thirteenth Preferred Embodiment

In a semiconductor light emitting device according to the present embodiment, the p-type cladding layer 10 is formed from AlGaN layers of superlattice structure in the ninth preferred embodiment. The superlattice AlGaN layers have the average Al composition ratio z satisfying $0.01 \leq z < 0.06$.

The other structure is the same as that of the ninth preferred embodiment, and repeated explanation thereof is thus omitted here.

Since the p-type cladding layer 10 is formed from the AlGaN layers of superlattice structure having the average Al composition ratio z ($0.01 \leq z < 0.06$), the semiconductor light emitting device according to the present embodiment achieves similar effects as those produced by the ninth preferred embodiment.

Further, with employment of the superlattice structure in the p-type cladding layer 10, dislocation can be stopped at the interface of the superlattice structure. As a result, the p-type cladding layer 10 can easily be made thick through the use of the superlattice structure, and the spreading of light can further be minimized by making the p-type cladding layer 10 thick.

In the case where the p-type cladding layer 10 includes a plurality of layers, an AlGaN layer of superlattice structure may be used as one of them.

Fourteenth Preferred Embodiment

In a semiconductor light emitting device according to the present embodiment, the p-type cladding layer 10 is formed from AlGaN layers of superlattice structure in the tenth preferred embodiment. The p-type cladding layer 10 has the average Al composition ratio z satisfying $0.01 \leq z \leq 0.05$. The other structure is the same as that of the tenth preferred embodiment, and repeated explanation thereof is thus omitted here.

The semiconductor light emitting device according to the present embodiment has the above-described structure, and therefore, achieves similar effects as those produced by the tenth preferred embodiment.

Further, with employment of the superlattice structure in the p-type cladding layer 10, dislocation can be stopped at the interface of the superlattice structure. As a result, the p-type cladding layer 10 can easily be made thick through the use of the superlattice structure, and the spreading of light can further be minimized by making the p-type cladding layer 10 thick.

In the case where the p-type cladding layer 10 includes a plurality of layers, an AlGaN layer of superlattice structure may be used as one of them.

Fifteenth Preferred Embodiment

A semiconductor light emitting device according to the present embodiment includes the p-type cladding layer 18 having an Al composition ratio higher than the average Al composition ratio z ($0.01 \leq z < 0.06$) of the p-type cladding layer 10 formed on the p-type cladding layer 10 in the semiconductor light emitting device according to the eleventh preferred embodiment.

The other structure is the same as that of the eleventh preferred embodiment, and repeated explanation thereof is thus omitted here.

The semiconductor light emitting device according to the present embodiment has the above-described structure, and therefore, achieves similar effects as those produced by the eleventh preferred embodiment.

Further, with employment of the superlattice structure in the p-type cladding layer 10, dislocation can be stopped at the interface of the superlattice structure. As a result, the p-type cladding layer 10 can easily be made thick through the use of the superlattice structure, and the spreading of light can further be minimized by making the p-type cladding layer 10 thick.

In the case where the p-type cladding layer 10 includes a plurality of layers, an AlGaN layer of superlattice structure may be used as one of them.

Sixteenth Preferred Embodiment

In a semiconductor light emitting device according to the present embodiment, the p-type cladding layer 10 is formed from AlGaN layers of superlattice structure (average Al composition ratio z: $0.01 \leq z \leq 0.05$) in the twelfth preferred embodiment. The other structure is the same as that of the twelfth preferred embodiment, and repeated explanation thereof is thus omitted here.

The semiconductor light emitting device according to the present embodiment has the above-described structure, and therefore, achieves similar effects as those produced by the twelfth preferred embodiment.

In the case where the p-type cladding layer 10 includes a plurality of layers, an AlGaN layer of superlattice structure may be used as one of them.

While the invention has been shown and described in detail, the foregoing description is in all aspects illustrative and not restrictive. It is therefore understood that numerous modifications and variations can be devised without departing from the scope of the invention.

What is claimed is:

1. A semiconductor light emitting device comprising:
   a plurality of layers of III-V compound semiconductor materials, each layer including at least N, the plurality of layers including an n-type cladding layer, a p-type cladding layer, and an active layer interposed between said n-type cladding layer and said p-type cladding layer, wherein said n-type cladding layer includes a first n-type layer of n-type $Al_xGa_{1-x}N$ having an Al composition ratio x satisfying $0.01 \leq x < 0.06$, said n-type cladding layer includes a second n-type layer of n-type $Al_yGa_{1-y}N$ having an Al composition ratio y higher than x, said second n-type layer is separated from said active layer by at least part of said first n-type layer, said p-type cladding layer includes a first p-type layer of p-type $Al_zGa_{1-z}N$ having an Al composition ratio z satisfying $0.01 \leq z < 0.06$, said p-type cladding layer further includes a second p-type layer of p-type AlGaN having an Al composition ratio higher than z, and said second p-type layer is separated from said active layer by at least part of said first p-type layer.

2. The semiconductor light emitting device according to claim 1, wherein said first n-type layer has a thickness of at least 300 nm.

3. The semiconductor light emitting device according to claim 1, wherein the Al composition ratio x satisfies $0.01 \leq x \leq 0.05$.

4. The semiconductor light emitting device according to claim 1, wherein said first n-type layer has a superlattice structure.

5. The semiconductor light emitting device according to claim 1, wherein said second n-type layer has a superlattice structure.

6. The semiconductor light emitting device according to claim 1, wherein said first p-type layer has a thickness of at least 300 nm.

7. The semiconductor light emitting device according to claim 1, wherein said first p-type layer has the Al composition ratio z satisfying $0.01 \leq z \leq 0.05$.

8. The semiconductor light emitting device according to claim 1, wherein said first p-type layer has a superlattice structure.

9. The semiconductor light emitting device according to claim 1, wherein said second p-type layer has a superlattice structure.

10. A semiconductor light emitting device comprising:

a plurality of layers of III-V compound semiconductor materials, each layer including at least N, the plurality of layers including an n-type cladding layer, a p-type cladding layer, and an active layer interposed between said n-type cladding layer and said p-type cladding layer, wherein said n-type cladding layer includes a first n-type $Al_xGa_{1-x}N$ layer having an Al composition ratio x, said n-type cladding layer includes a second n-type $Al_yGa_{1-y}N$ layer having an Al composition y higher than x, said second n-type layer is separated from said active layer by at least part of said first n-type layer, said p-type cladding layer includes a first p-type layer of p-type $Al_zGa_{1-z}N$ having an Al composition ratio z satisfying $0.01 \leq z < 0.06$, said p-type cladding layer further includes a second p-type layer of p-type AlGaN having an Al composition ratio higher than z, and said second p-type layer is separated from said active layer by at least part of said first p-type layer.

11. The semiconductor light emitting device according to claim 1, wherein each layer of said plurality of III-V compound semiconductor materials includes Ga.

12. The semiconductor light emitting device according to claim 10, wherein each layer of said plurality of III-V compound semiconductor materials includes Ga.

* * * * *